(12) United States Patent
Wu

(10) Patent No.: US 12,034,070 B2
(45) Date of Patent: Jul. 9, 2024

(54) SEMICONDUCTOR DEVICE STRUCTURES AND METHODS OF MANUFACTURING THE SAME

(71) Applicant: INNOSCIENCE (ZHUHAI) TECHNOLOGY CO., LTD., Zhuhai (CN)

(72) Inventor: Peng-Yi Wu, Zhuhai (CN)

(73) Assignee: INNOSCIENCE (ZHUHAI) TECHNOLOGY CO., LTD., Zhuhai (CN)

( * ) Notice: Subject to any disclaimer, the term of this patent is extended or adjusted under 35 U.S.C. 154(b) by 1010 days.

(21) Appl. No.: 16/967,132

(22) PCT Filed: Jun. 23, 2020

(86) PCT No.: PCT/CN2020/097752
§ 371 (c)(1),
(2) Date: Aug. 4, 2020

(87) PCT Pub. No.: WO2021/258293
PCT Pub. Date: Dec. 30, 2021

(65) Prior Publication Data
US 2022/0376096 A1 Nov. 24, 2022

(51) Int. Cl.
*H01L 29/778* (2006.01)
*H01L 29/20* (2006.01)
*H01L 29/66* (2006.01)

(52) U.S. Cl.
CPC ...... *H01L 29/7786* (2013.01); *H01L 29/2003* (2013.01); *H01L 29/66462* (2013.01)

(58) Field of Classification Search
CPC .......... H01L 29/7786; H01L 29/66462; H01L 29/2003
See application file for complete search history.

(56) References Cited

U.S. PATENT DOCUMENTS 8,866,192 B1 * 10/2014 Chen ................... H01L 21/2652
257/194
10,192,959 B2 1/2019 Zhao
(Continued)

FOREIGN PATENT DOCUMENTS

CN 103972344 A 8/2014
CN 105304783 A 2/2016
(Continued)

OTHER PUBLICATIONS

International Search Report and Written Opinion of the corresponding PCT application No. PCT/CN2020/097752 dated Mar. 24, 2021.
(Continued)

*Primary Examiner* — Erik Kielin
(74) *Attorney, Agent, or Firm* — JCIPRNET

(57) ABSTRACT

Semiconductor device structures and methods for manufacturing the same are provided. The semiconductor device structure includes a substrate, a first layer and a second layer. The first layer is disposed on and in contact with the substrate. The first layer includes $Al_{X1}Ga_{(1-X1)}N$, wherein $0.5 \leq X1 < 1$. The second layer is disposed on and in contact with the first layer. The second layer includes Al, Ga and N.

10 Claims, 12 Drawing Sheets

(56) References Cited

U.S. PATENT DOCUMENTS

| | | |
|---|---|---|
| 2012/0153351 A1 | 6/2012 | Chandolu et al. |
| 2013/0099243 A1 | 4/2013 | Chen et al. |
| 2015/0111370 A1* | 4/2015 | Wang ................ H01L 21/02491 |
| | | 438/478 |
| 2019/0109208 A1* | 4/2019 | Wang .................... H01L 29/205 |

FOREIGN PATENT DOCUMENTS

| | | |
|---|---|---|
| CN | 107464843 A | 12/2017 |
| CN | 110767784 A | 2/2020 |

OTHER PUBLICATIONS

First Office Action of the corresponding China patent application No. 202080003350.7 dated Jun. 23, 2021.
Second Office Action of the corresponding China patent application No. 202080003350.7 dated Mar. 14, 2022.
Yunhao Lin et al., "Performance improvement of GaN-based light-emitting diodes grown on Si (111) substrates by controlling the reactor pressure of GaN nucleation layers", Journal of Materials Chemistry C, Nov. 24, 2014, p. 1-17.
Third Office Action of the corresponding China patent application No. 202080003350.7 dated Jun. 14, 2022.

* cited by examiner

SEMICONDUCTOR DEVICE STRUCTURES AND METHODS OF MANUFACTURING THE SAME

BACKGROUND

1. Field of the Disclosure

The present disclosure relates to a semiconductor device structure and more particularly to a semiconductor device structure with an interlayer and a nucleation layer.

2. Description of Related Art

Components including direct bandgap semiconductors, for example, semiconductor components including group III-V materials or group III-V compounds (Category: III-V compounds) can operate or work under a variety of conditions or in a variety of environments (e.g., at different voltages and frequencies).

The semiconductor components may include a heterojunction bipolar transistor (HBT), a heterojunction field effect transistor (HFET), a high-electron-mobility transistor (HEMT), a modulation-doped FET (MODFET) and the like.

SUMMARY

According to some embodiments of the present disclosure, a semiconductor device structure includes a substrate, a first layer, a second layer, a first nitride semiconductor layer and a second nitride semiconductor layer. The first layer is disposed on and in contact with the substrate. The first layer includes $Al_{X1}Ga_{(1-X1)}N$, wherein $0.5 \leq X1 < 1$. The second layer is disposed on and in contact with the first layer. The second layer includes Al, Ga and N. The first nitride semiconductor layer is on the second layer. The second nitride semiconductor layer is on the first nitride semiconductor layer and has a band gap larger than a band gap of the first nitride semiconductor layer.

According to some embodiments of the present disclosure, a semiconductor device structure includes a substrate, a first layer, a second layer, a first nitride semiconductor layer and a second nitride semiconductor layer. The first layer is disposed on and in contact with the substrate. The first layer includes Al, Ga and N. The second layer is disposed on the first layer. The second layer includes a first sublayer in contact with the first layer. The first sublayer includes Al, Ga and N. The difference of the atomic weight percentage of Al between the first layer and the first sublayer of the second layer ranges from 0.25 to 0.5. The first nitride semiconductor layer is disposed on the second layer. The second nitride semiconductor layer is disposed on the first nitride semiconductor layer and has a band gap larger than a band gap of the first nitride semiconductor layer.

According to some embodiments of the present disclosure, a method of manufacturing a semiconductor device structure includes: providing a substrate; forming a first layer on the substrate, wherein the first layer includes $Al_{X1}Ga_{(1-X1)}N$; forming a second layer on the first layer by: forming a first sublayer on the first layer, and forming a second sublayer on the first sublayer; wherein the first sublayer includes $Al_{Y1}Ga_{(1-Y1)}N$, and X1 is greater than Y1.

BRIEF DESCRIPTION OF THE DRAWINGS

Aspects of the present disclosure are readily understood from the following detailed description when read with the accompanying figures. It should be noted that various features may not be drawn to scale. In fact, the dimensions of the various features may be arbitrarily increased or reduced for clarity of discussion.

Figure 1:
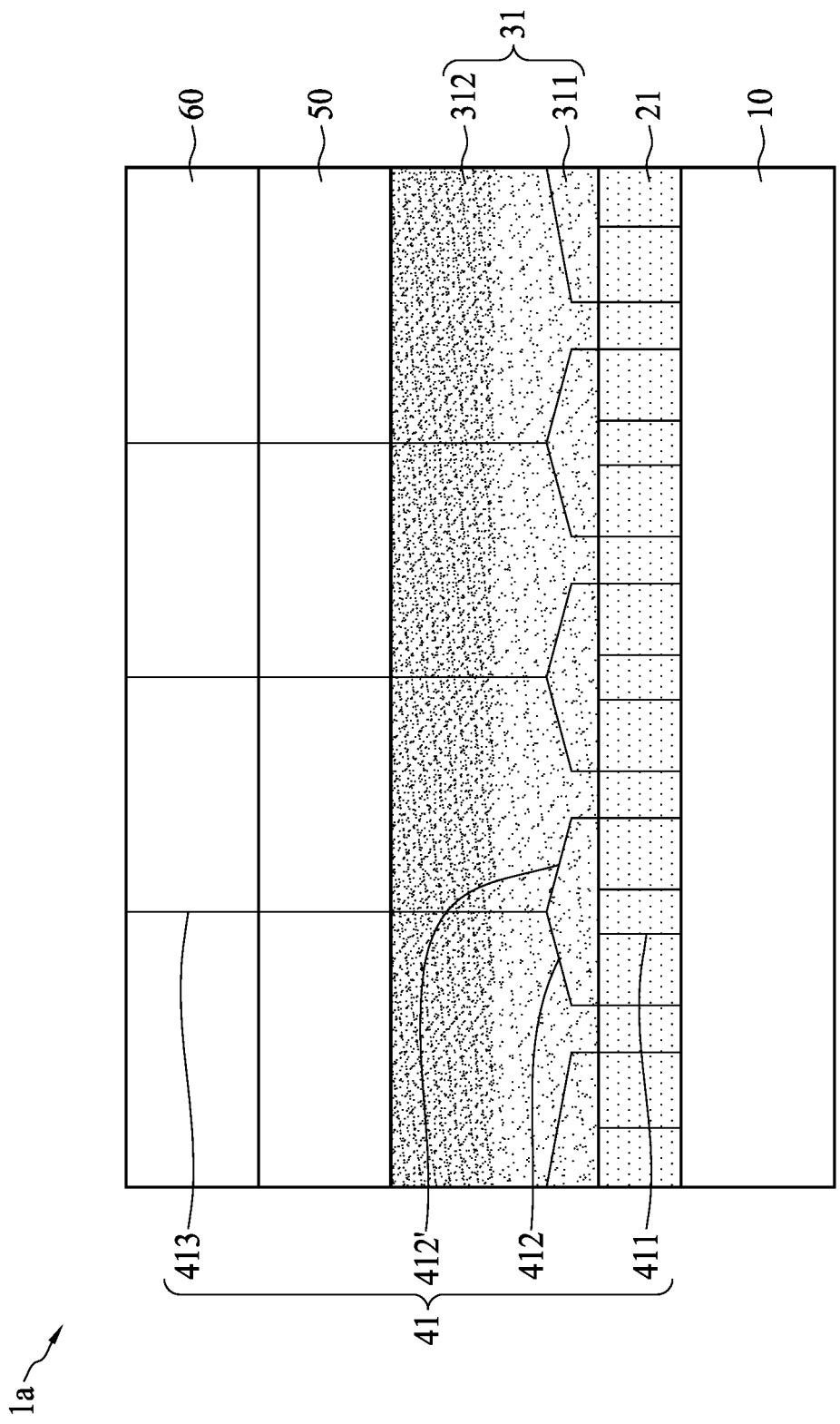
FIG. 1 is a cross-sectional view of a semiconductor device structure in accordance with some embodiments of the present disclosure.

Common reference numerals are used throughout the drawings and the detailed description to indicate the same or similar components. The present disclosure will be more apparent from the following detailed description taken in conjunction with the accompanying drawings.

DETAILED DESCRIPTION

The following disclosure provides many different embodiments, or examples, for implementing different features of the provided subject matter. Specific examples of components and arrangements are described below. These are, of course, merely examples and are not intended to be limiting. In the present disclosure, reference to the formation or disposal of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure are discussed in detail as follows. It should be appreciated, however, that the present disclosure provides many applicable concepts that can be embodied in a wide variety of specific contexts. The specific embodiments discussed are merely illustrative and do not limit the scope of the disclosure.

The present disclosure provides a semiconductor device structure including multiple III-V group layers formed on a substrate. As a result, the semiconductor device structure may include a channel layer and a barrier layer with fewer defects, such as threading dislocations generated therein. The semiconductor device structure of the present disclosure can be applied in, without limitation, HEMT devices, especially in low voltage HEMT devices, high voltage HEMT devices and/or radio frequency (RF) HEMT devices.

FIG. 1 is a cross-sectional view of a semiconductor device structure 1a in accordance with some embodiments of the present disclosure.

The semiconductor device structure 1a may include a substrate 10, a layer 21, a layer 31, a channel layer 50 and a barrier layer 60.

The substrate 10 may include, without limitation, silicon (Si), doped Si, silicon carbide (SiC), germanium silicide (SiGe), gallium arsenide (GaAs), or other semiconductor materials. The substrate 10 may include, without limitation, sapphire, silicon on insulator (SOI), or other suitable materials.

The layer 21 may be disposed on the substrate 10. The layer 21 may be in contact with the substrate 10. The layer 21 may include aluminum (Al). The layer 21 may include nitrogen (N). The layer 21 may include gallium (Ga). The layer 21 may include indium (In). The layer 21 may include a combination selected from Al, Ga, N and In. The layer 21 may also be referred to as an interlayer.

The layer 21 may include $Al_{X1}Ga_{(1-X1)}N$. $0.5 \leq X1 \leq 0.6$. $0.6 \leq X1 \leq 0.7$. $0.7 \leq X1 \leq 0.8$. $0.8 \leq X1 \leq 0.9$. $0.9 \leq X1 < 1.0$. The thickness of the layer 21 may range from about 10 nm to about 3 μm.

The layer 21 may be used as a buffer layer between the substrate 10 and subsequently formed layers, such as the layer 31, to prevent cracks between two layers. As the ratio of aluminum increases, fewer defects are formed.

The layer 21 may include $In_\alpha Al_\beta Ga_{(1-\alpha-\beta)}N$, where $0 \leq \alpha \leq 0.2$, $0.5 \leq \beta < 0.8$.

The atomic weight percentage of Al in the layer 21 may range from about 0.5 to about 0.6. The atomic weight percentage of Al in the layer 21 may range from about 0.6 to about 0.7. The atomic weight percentage of Al in the layer 21 may range from about 0.7 to about 0.8. The atomic weight percentage of Al in the layer 21 may range from about 0.8 to about 0.9. The atomic weight percentage of Al in the layer 21 may be greater than or equal to 0.9, and less than 1.0.

In some other embodiments, the layer 21 can further include an aluminum nitride (AlN) layer. The AlN layer may be in contact with the substrate. The AlN layer can serve as a buffer layer. The AlN layer can function as a buffer layer. However, a relatively great lattice mismatch exists between the AlN layer and the layer formed thereon may result in relatively great defect density.

The layer 31 may be disposed on the layer 21. The layer 31 may be in contact with the layer 21. The layer 31 may include aluminum (Al). The layer 31 may include nitrogen (N). The layer 31 may include gallium (Ga). The layer 31 may include indium (In). The layer 31 may include a combination selected from Al, Ga, N and In. Given that the layer 31 may include gallium, the layer 21 may include at least gallium to reduce lattice mismatch between the layer 21 and the layer 31.

The layer 31 may include a sublayer 311 and a sublayer 312. The sublayer 311 and the sublayer 312 may be formed by different process conditions. No boundary exists between the sublayer 311 and the sublayer 312. There is substantially no boundary between the sublayer 311 and the sublayer 312. No interface exists between the sublayer 311 and the sublayer 312. There is substantially no interface between the sublayer 311 and the sublayer 312. That is, the sublayer 311 and the sublayer 312 may be regarded as an entire structure. In other embodiments, there is a boundary formed between the sublayer 311 and the sublayer 312. The formation of the sublayer 311 and the sublayer 312 will be discussed in FIG. 5A, FIG. 5B, FIG. 5C and FIG. 5D.

The sublayer 311 may be disposed on the layer 21. The sublayer 311 may be in contact with the layer 21. The sublayer 311 may also be referred to as a nucleation layer.

As shown in FIG. 1, defects may exist in the layer 21, the layer 31, the channel layer 50 and the barrier layer 60. The defects may include, but is not limited to, dislocations, grain boundaries and surface states. For example, the dislocation 41 may include a dislocation 411, a dislocation 412, a dislocation 412' and a dislocation 413. The dislocation 411 may terminate at an interface between the layer 21 and the layer 31. The dislocation 411 may terminate at an interface between the layer 21 and the sublayer 311. The dislocation 412 may be bent and terminate in the layer 31. The dislocation 412 may be bent and terminate in the sublayer 311. The dislocation 412' may be bent and terminate in the layer 31. The dislocation 412' may be bent and terminate in the sublayer 311. The dislocation 413 may extend from the layer 31. The dislocation 413 may extend from the layer 31 into the channel layer 50. The dislocation 413 may extend from the layer 31 into the barrier layer 60. The dislocation 413 may extend from the sublayer 311 into the sublayer 312. The dislocation 413 may extend from where the dislocation 412 and the dislocation 412' terminate into the sublayer 312, the channel layer 50 and the barrier layer 60.

The sublayer 311 may include Al. The sublayer 311 may include Ga. The sublayer 311 may include N. The sublayer 311 may include In. The sublayer 311 may include a combination selected from Al, Ga, N and In. The sublayer 311 may include $Al_{Y1}Ga_{(1-Y1)}N$. $0 < Y1 \leq 0.1$. $0.1 \leq Y1 \leq 0.2$. $0.2 \leq Y1 \leq 0.3$. $0.3 \leq Y1 \leq 0.4$. $0.4 \leq Y1 \leq 0.5$.

The sublayer 311 may include $In_\gamma Al_\delta Ga_{(1-\gamma-\delta)}N$. $0 \leq \gamma \leq 0.5$, $0 \leq \delta \leq 0.5$. When $0 \leq \gamma \leq 0.5$, and $0 \leq \delta \leq 0.5$, defects may be properly reduced.

The atomic weight percentage of Al in the sublayer 311 may be greater than 0 and less than or equal to 0.1. The atomic weight percentage of Al in the sublayer 311 may range from about 0.1 to about 0.2. The atomic weight percentage of Al in the sublayer 311 may range from about 0.2 to about 0.3. The atomic weight percentage of Al in the sublayer 311 may range from about 0.3 to about 0.4. The atomic weight percentage of Al in the sublayer 311 may range from about 0.4 to about 0.5.

The difference between X1 and Y1 may range from about 0.25 to about 0.3. The difference between X1 and Y1 may range from about 0.3 to about 0.35. The difference between X1 and Y1 may range from about 0.35 to about 0.4. The difference between X1 and Y1 may range from about 0.4 to about 0.45. The difference between X1 and Y1 may range from about 0.45 to about 0.5.

The difference of the atomic weight percentage of aluminum between the layer 21 and the sublayer 311 may range from about 0.25 to about 0.3. The difference of the atomic weight percentage of aluminum between the layer 21 and the sublayer 311 may range from about 0.3 to about 0.35. The difference of the atomic weight percentage of aluminum between the layer 21 and the sublayer 311 may range from about 0.35 to about 0.4. The difference of the atomic weight percentage of aluminum between the layer 21 and the sublayer 311 may range from about 0.4 to about 0.45. The difference of the atomic weight percentage of aluminum between the layer 21 and the sublayer 311 may range from about 0.45 to about 0.5.

As the difference between X1 and Y1 increases or becomes greater, dislocation 41 may be bent to terminate in the sublayer 311, and therefore the defects may not propagate into the layer(s) formed over the sublayer 311. In other words, the issues caused by the defects can be mitigated, alleviated or eliminated. For example, the relatively great difference between X1 and Y1 can facilitate termination of the dislocation 412 in the sublayer 311. For example, the relatively great difference between X1 and Y1 can facilitate termination of the dislocation 412' in the sublayer 311.

However, the difference between X1 and Y1 may also cause defects due to lattice mismatch between the layer 21 and the sublayer 311. For example, if the difference between X1 and Y1 goes over (or greater) 0.5, the defects resulted from lattice mismatch between the layer 21 and the sublayer 311 may adversely affect reliability or performance of the semiconductor device structure 1a. In other words, the difference between X1 and Y1 has to be well controlled. For example, the difference between X1 and Y1 can range from about 0.25 to about 0.5.

The sublayer 311 may be formed by, for example, a quasi-two-dimensional growth process. In a quasi-two-dimensional growth process, multiple islands, for example, island 3111, island 3112, island 3113 and island 3114 shown in FIG. 5A, may be formed, and then merged to form a continuous layer. As the island 3111, island 3112, island 3113 and island 3114 grow, the dislocation 41 may be bent. More specifically, the extending direction of the dislocation 41 may be changed. As shown in FIG. 1, the dislocation 412 and the dislocation 412' may extend along a longitudinal direction in the layer 21 and be bent in the sublayer 311. The dislocation 412 and the dislocation 412' may extend toward a direction that is more horizontal than the longitudinal direction in the sublayer 311. When bended dislocation 412 and bended dislocation 412' meet, the bended dislocations 412 and 412' may terminate, or join together to form the dislocation 413, which may propagate into the channel layer 50 and the barrier layer 60. If the difference between X1 and Y1 (or the difference of the atomic weight percentage between the layer 21 and the sublayer 311) is less than 0.25, an island may not be formed to bend the dislocation. If the difference between X1 and Y1 is greater than 0.5, the density of islands 3111-3114 may not be great enough to merge or join the islands. That is, when the difference between X1 and Y1 ranges from about 0.25 to about 0.5, the islands 3111-3114 may be formed, and relatively less dislocations are formed.

The sublayer 312 may be disposed on the sublayer 311. The sublayer 312 may be in contact with the sublayer 311. The sublayer 312 may also be referred to as a main layer.

The sublayer 312 may include Al. The sublayer 312 may include Ga. The sublayer 312 may include N. The sublayer 312 may include In. The sublayer 312 may include a combination selected from Al, Ga, N and In. The sublayer 312 may include $Al_{Z1}Ga_{(1-Z1)}N$. $0 \leq Z1 \leq 0.1$. $0.1 \leq Z1 \leq 0.2$. $0.2 \leq Z1 \leq 0.3$. $0.3 \leq Z1 \leq 0.4$. $0.4 \leq Z1 \leq 0.5$.

The formation of the sublayer 312 may be used to, but is not limited to, improve the termination of the dislocations. More specifically, some dislocations are not merged in the sublayer 311 but can be merged in the sublayer 312. For example, if the dislocation 412 and the dislocation 412' are bent but do not terminate in the sublayer 311, the dislocations 412 and dislocation 412' will meet at the sublayer 312 and terminate in the sublayer 312. In addition, since the sublayer 311 is formed by merging multiple islands 3111-3114, the sublayer 311 may have a greater surface roughness. The formation of the sublayer 312 can flatten the sublayer 311. The sublayer 312 can provide a substantially flat surface, assisting in forming subsequent layers.

The sublayer 312 may include $In_\gamma Al_\delta Ga_{(1-\gamma-\delta)}N$. $0 \leq \gamma \leq 0.5$, $0 \leq \delta \leq 0.5$. When $0 \leq \gamma \leq 0.5$, and $0 \leq \delta \leq 0.5$, defects may be properly reduced. When $0 \leq \gamma \leq 0.5$, and $0 \leq \delta \leq 0.5$, the dislocation 41 may properly terminate.

Both of the sublayer 311 and the sublayer 312 may include AlGaN. The sublayer 311 may include AlGaN, and the sublayer 312 may include GaN. One of the sublayer 311 and the sublayer 312 may include InAlGaN, and the other one may include AlGaN (or GaN).

The channel layer 50 (or a nitride semiconductor layer) may be disposed on the layer 31. The channel layer 50 may be disposed on the sublayer 312 of the layer 31. The channel layer 50 may include a group III-V layer. The channel layer 50 may include, but is not limited to, a group III nitride, for example, a compound $In_a Al_b Ga_{1-a-b}N$, in which $a+b \leq 1$. The group III nitride further includes, but is not limited to, for example, a compound $Al_a Ga_{(1-a)}N$, in which $a \leq 1$. The channel layer 50 may include a gallium nitride (GaN) layer. GaN has a bandgap of about 3.4 eV. The thickness of the channel layer 50 may range, but is not limited to, from about 0.5 μm to about 10 μm.

The barrier layer 60 (or a nitride semiconductor layer) may be disposed on the channel layer 50. The barrier layer 60 may include a group III-V layer. The barrier layer 60 may include, but is not limited to, a group III nitride, for example, a compound $In_a Al_b Ga_{1-a-b}N$, in which $a+b \leq 1$. The group III nitride may further include, but is not limited to, for example, a compound $Al_a Ga_{(1-a)}N$, in which $a \leq 1$. The barrier layer 60 has a greater bandgap than that of the channel layer 50. The barrier layer 60 may include an aluminum gallium nitride (AlGaN) layer. AlGaN has a bandgap of about 4.0 eV. The thickness of the barrier layer 60 may range, but is not limited to, from about 10 nm to about 100 nm.

A heterojunction is formed between the barrier layer 60 and the channel layer 50, and the polarization of the heterojunction forms a two dimensional electron gas (2DEG) region in the channel layer 50.

It should be noted that the layer 21 and the layer 31 have specific compositions. It should be noted that the dislocation 41 may be bent and terminate due to the application of the layer 21 and the layer 31. As a result, fewer dislocations extend along the longitudinal direction, improving the film quality of the channel layer 50 and/or the barrier layer 60. Therefore, on resistance (Rds-on) of the semiconductor device structure 1a may be improved. For example, on resistance (Rds-on) of the semiconductor device structure 1a may be reduced. The layer 21 may include $Al_{X1}Ga_{(1-X1)}N$, the sublayer 311 may include $Al_{Y1}Ga_{(1-Y1)}N$, and the difference between X1 and Y1 ranges from about 0.25 to about 0.5. When the difference between X1 and Y1 ranges from about 0.25 to about 0.5, the defect density in the layer 31 may be 50% less than that in the layer 21.

Figure 2:
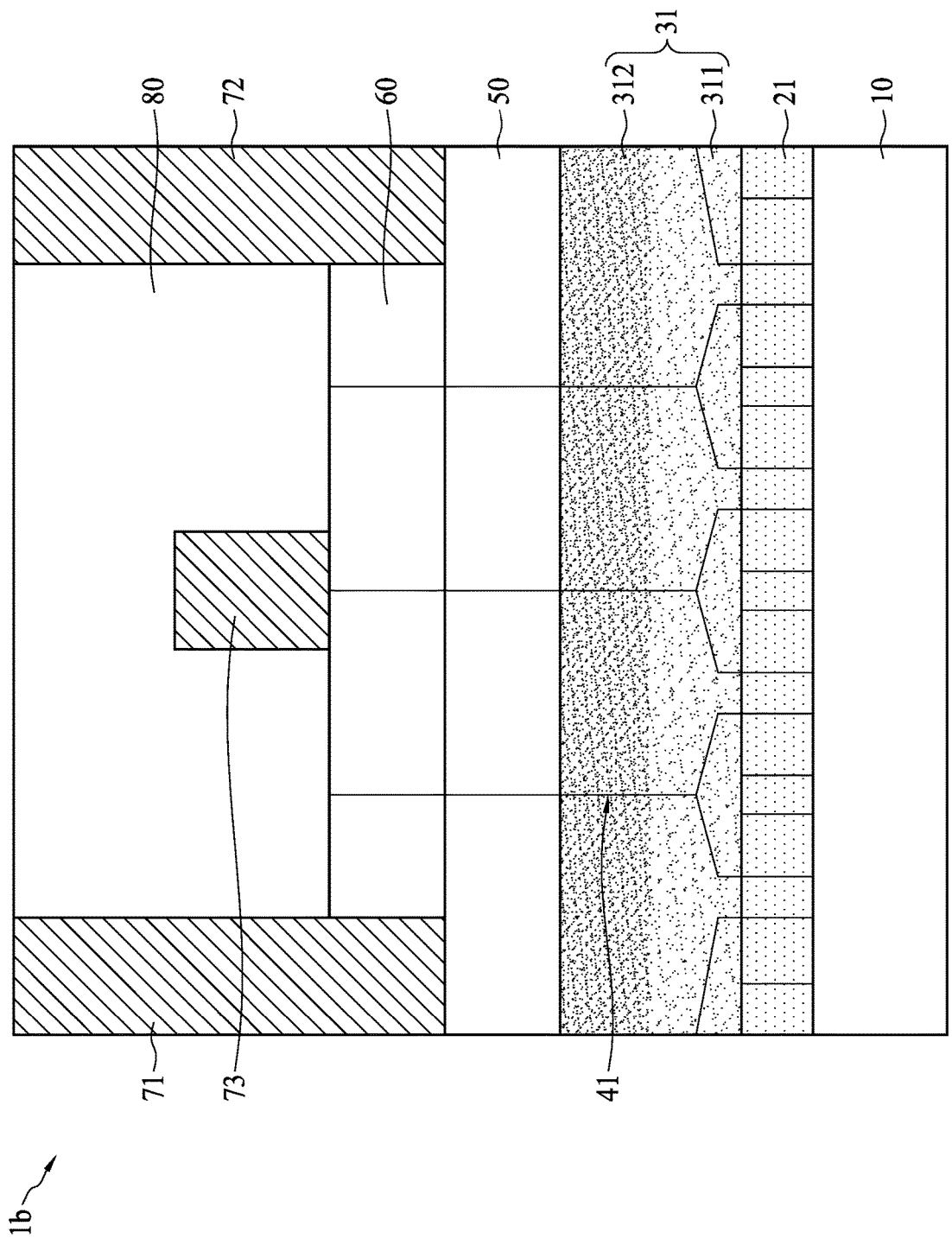
FIG. 2 is a cross-sectional view of a semiconductor device structure in accordance with some embodiments of the present disclosure.

FIG. 2 is a cross-sectional view of a semiconductor device structure 1b in accordance with some embodiments of the present disclosure.

The semiconductor device structure 1b has a structure similar to the semiconductor device structure 1a of FIG. 1. The difference lies in that the semiconductor device structure 1b may further include a source 71, a drain 72, a gate 73 and a passivation layer 80.

The source 71 and the drain 72 may be disposed between two opposite sides of the gate 73. Although the source 71 and the drain 72 are respectively disposed on two opposite sides of the gate 73 in FIG. 2, the source 71, the drain 72, and the gate 73 may have different configurations in other embodiments of the present disclosure due to the design requirements.

The source 71 and the drain 72 may include, for example, without limitation, a conductive material. The conductive material may include, but is not limited to, for example, metals, alloys, doped semiconductor materials (e.g., doped crystalline silicon), or other suitable conductor materials.

The source 71 may end at an interface of the channel layer 50 and the barrier layer 60. The drain 72 may end at an interface of the channel layer 50 and the barrier layer 60. However, the present disclosure is not intended to be limited thereto. In other embodiments, a portion of the source 71 may be located in the channel layer 50. A portion of the drain 72 may be located in the channel layer 50. In some other embodiments, the source 71 may be disposed on the channel layer 50. In some other embodiments, the drain 72 may be disposed on the channel layer 50. The source 71 may run through the passivation layer 80 and the barrier layer 60 to contact the channel layer 50. The drain 72 may run through the passivation layer 80 and the barrier layer 60 to contact the channel layer 50. The source 71 may end at the barrier layer 60. The source 71 may not be in contact with the channel layer 50. The drain 72 may end at the barrier layer 60. The drain 72 may not be in contact with the channel layer 50.

The gate 73 may be disposed on the barrier layer 60. The gate 73 may include, but is not limited to, a gate dielectric layer and a gate conductive structure disposed thereon. The gate dielectric layer may include one or more layers of a dielectric material, such as silicon oxide, silicon nitride, or high-k dielectric material or other suitable dielectric material. The gate conductive structure may include titanium (Ti), tantalum (Ta), tungsten (W), aluminum (Al), cobalt (Co), copper (Cu), nickel (Ni), platinum (Pt), lead (Pb), molybdenum (Mo) and compounds thereof (such as, but not limited to, titanium nitride (TiN), tantalum nitride (TaN), other conductive nitrides, or conductive oxides), metal alloys (such as aluminum-copper alloy (Al—Cu)), or other suitable materials.

The passivation layer 80 may cover the gate 73. The passivation layer 80 may include, but is not limited to, oxide or nitride, such as SiN, $SiO_2$ and the like. The passivation layer 80 may include, but is not limited to, a composite layer of an oxide and a nitride, such as $Al_2O_3$/SiN, $Al_2O_3$/$SiO_2$, AlN/SiN, AlN/$SiO_2$, and the like.

As shown in FIG. 2, the semiconductor device structure 1b is a depletion-mode device, which is preset to be in an ON state when the gate 73 is in a zero bias state. However, the present disclosure is not intended to be limited thereto. In other embodiments, the semiconductor device structure 1b is an enhancement-mode device, which is preset to be in an OFF state when the gate 73 is in a zero bias state.

Figure 3:
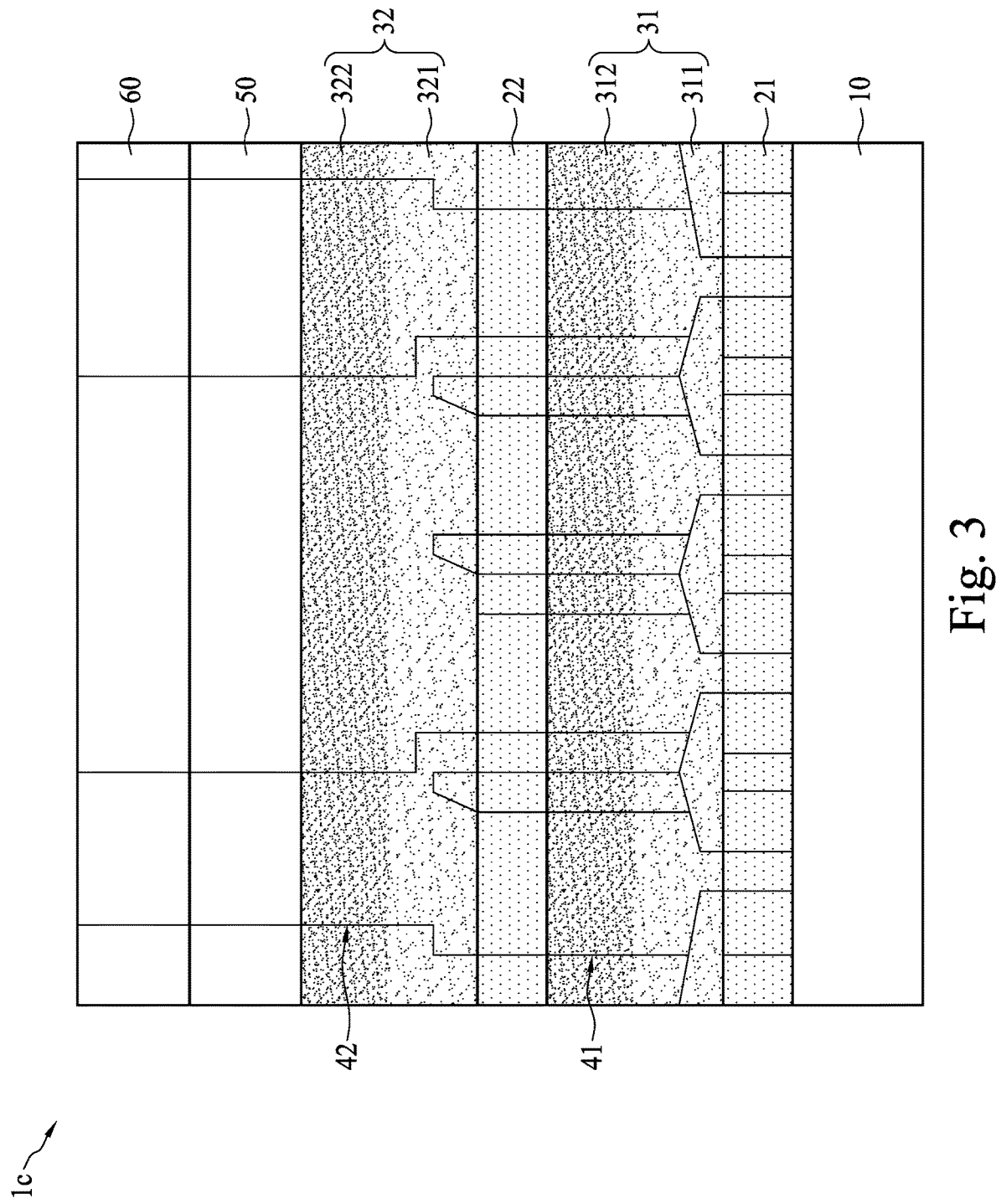
FIG. 3 is a cross-sectional view of a semiconductor device structure in accordance with some embodiments of the present disclosure.

FIG. 3 is a cross-sectional view of a semiconductor device structure 1c in accordance with some embodiments of the present disclosure.

The semiconductor device structure 1c has a structure similar to the semiconductor device structure 1a of FIG. 1. The difference lies in that the semiconductor device structure 1c may further include a layer 22 and a layer 32.

The layer 22 may be disposed on the layer 31. The layer 22 may be in contact with the layer 31. The layer 22 may be disposed on the sublayer 312. The layer 22 may be in contact with the sublayer 312. The layer 22 may include Al. The layer 22 may include Ga. The layer 22 may include N. The layer 22 may include In. The layer 22 may include a combination of Al, Ga, N and In. The thickness of the layer 22 may range from about 10 nm to about 3 μm. The layer 22 may also be referred to as an interlayer.

The layer 22 may include $Al_{X2}Ga_{(1-X2)}N$. 0.5≤X2≤0.6. 0.6≤X2≤0.7. 0.7≤X2≤0.8. 0.8≤X2≤0.9. 0.9≤X2<1.0. X2 is greater than Y1. The difference between X2 and Y1 may range from about 0.25 to about 0.5. X2 may be greater than Z1. The difference between X2 and Z1 may range from about 0.25 to about 0.5. When the difference between X2 and Y1 (or Z1) ranges from 0.25 to about 0.5, fewer defects, such as dislocations 42, may be generated.

The layer 32 may be disposed on the layer 22. The layer 32 may be in contact with the layer 22. The layer 32 may include Al. The layer 32 may include Ga. The layer 32 may include N. The layer 32 may include In. That is, the layer 32 may include a combination selected from Al, Ga, N and In.

The layer 32 may include a sublayer 321 and a sublayer 322. The sublayer 321 and the sublayer 322 may be formed by different process conditions. There is substantially no boundary between the sublayer 321 and the sublayer 322. That is, the sublayer 321 and the sublayer 322 may be regarded as an entire structure. There is a boundary between the sublayer 321 and the sublayer 322. That is, the sublayer 321 and the sublayer 322 may be observed as two layers.

The sublayer 321 may be disposed on the layer 22. The sublayer 321 may be in contact with the layer 22. The sublayer 321 may also be referred to as a nucleation layer.

The sublayer 321 may include Al. The sublayer 321 may include Ga. The sublayer 321 may include N. The sublayer 321 may include In. The sublayer 321 may include a combination selected from Al, Ga, N and In. The sublayer 321 may include $Al_{Y2}Ga_{(1-Y2)}N$. 0<Y2≤0.1. 0.1≤Y2≤0.2. 0.2≤Y2≤0.3. 0.3≤Y2≤0.4. 0.4≤Y2≤0.5.

The difference between X2 and Y2 may range from about 0.25 to about 0.3. The difference between X2 and Y2 may range from about 0.3 to about 0.35. The difference between X2 and Y2 may range from about 0.35 to about 0.4. The difference between X2 and Y2 may range from about 0.4 to about 0.45. The difference between X2 and Y2 may range from about 0.45 to about 0.5.

As the difference between X2 and Y2 increases, much more dislocations 42 may be bent, and then terminate. However, when the difference between X2 and Y2 is greater than 0.5, more defects may be generated due to a greater lattice mismatch between the layer 22 and the sublayer 321. To terminate defects and to reduce the generation of defects, the difference between X2 and Y2 preferably ranges from about 0.25 to about 0.5.

Figure 5A:
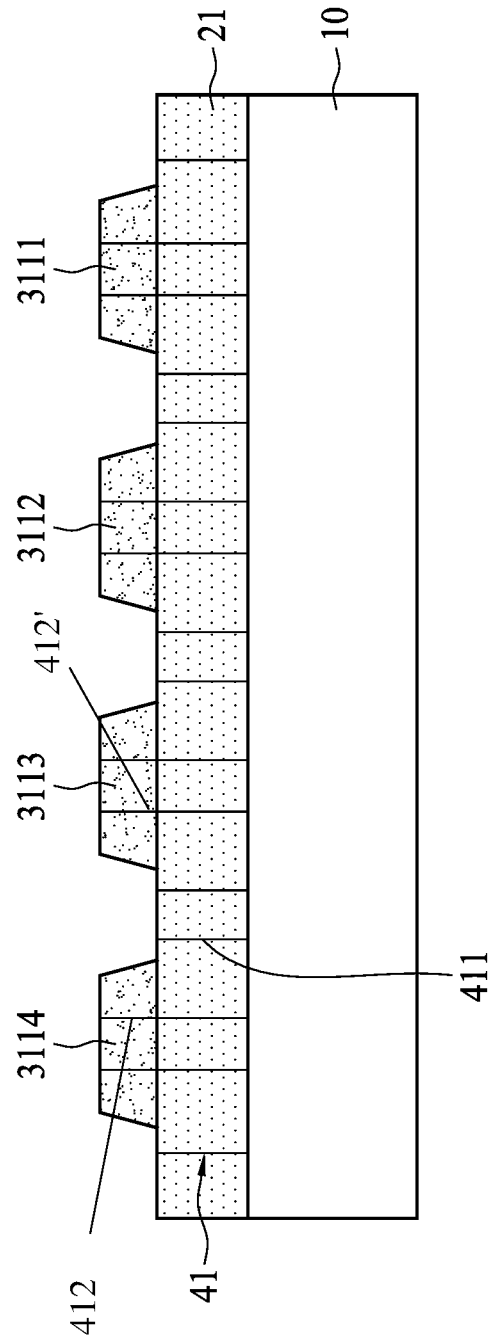

The sublayer 321 may be formed by, for example, a quasi-two-dimensional growth process. In a quasi-two-dimensional growth process, multiple islands, for example, island 3111, island 3112, island 3113 and island 3114 shown in FIG. 5A, are formed, and then merged to form a continuous layer. As the islands 3111-3114 grow, the dislocations 42 may be bent. More specifically, the extending direction of the dislocation 42 may be changed. As shown in FIG. 3, the dislocations 42 may extend along a longitudinal direction in the layer 22. However, as the dislocations 42 are far from the layer 22, the dislocations 42 may be bent and extend toward a direction that is more horizontal than the longitudinal direction. When two bended dislocations 42 meet, the bended dislocations 42 may terminate, leading to fewer dislocations extending along the longitudinal direction.

The sublayer 322 may be disposed on the sublayer 321. The sublayer 322 may be in contact with the sublayer 321. The sublayer 322 may also be referred to as a main layer.

The sublayer 322 may include Al. The sublayer 322 may include Ga. The sublayer 322 may include N. The sublayer 322 may include In. The sublayer 322 may include a combination selected from Al, Ga, N and In. The sublayer 322 may include $Al_{Z2}Ga_{(1-Z2)}N$. 0≤Z2≤0.1. 0.1≤Z2≤0.2. 0.2≤Z2≤0.3. 0.3≤Z2≤0.4. 0.4≤Z2≤0.5.

The sublayer 332 may be used to, but is not limited to, improve the termination of the dislocations. In addition, the formation of the sublayer 322 can flatten the sublayer 321.

The sublayer 322 can provide a substantially flat surface, assisting in forming subsequent layers.

In this embodiment, the defects, such as the dislocation 41 and the dislocation 42, are bent twice. Therefore, much fewer defects extend along the longitudinal direction and then extend into the channel layer 50 and the barrier layer 60, improving the film quality of the channel layer 50 and the barrier layer 60. That is, fewer defects exist in the channel layer 50 and the barrier layer 60 due to the application of the layer 21 and the layer 31. That is, much fewer defects exist in the channel layer 50 and the barrier layer 60 due to the application of the layer 22 and the layer 32. The density of dislocation in the layer 32 may be less than the density of dislocation in the layer 31. The density of dislocation in the sublayer 322 may be less than the density of dislocation in the sublayer 312.

FIG. 4, FIG. 5A, FIG. 5B, FIG. 5C, FIG. 5D and FIG. 6 illustrate various stages of a method for manufacturing a semiconductor device structure 1a in accordance with some embodiments of the present disclosure.

Figure 4:
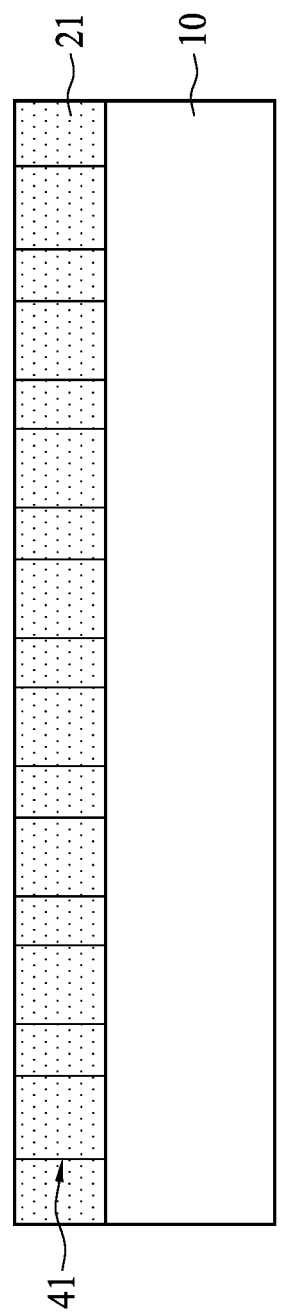
FIG. 4, FIG. 5A, FIG. 5B, FIG. 5C, FIG. 5D and FIG. 6 illustrate various stages of a method for manufacturing a semiconductor device structure in accordance with some embodiments of the present disclosure.

As shown in FIG. 4, a substrate 10 is provided. The layer 21 may be formed on the substrate 10. The layer 21 may be formed by metal organic chemical vapor deposition (MOCVD), metal organic vapor-phase epitaxy (MOVPE), epitaxial growth, or other suitable operations. The dislocations 41 may exist in the layer 21.

FIG. 5A, FIG. 5B, FIG. 5C and FIG. 5D illustrate the formation of the layer 31.

As shown in FIG. 5A, an island 3111, an island 3112, an island 3113 and an island 3114 may be formed on the layer 21. The island 3111, the island 3112, the island 3113 and the island 3114 may be separated from each other. The island 3111, the island 3112, the island 3113 and the island 3114 may be formed by a quasi-two-dimensional growth process. The island 3111, the island 3112, the island 3113 and the island 3114 may be formed at a temperature from about 500° C. to about 600° C. The island 3111, the island 3112, the island 3113 and the island 3114 may be formed at a temperature from about 600° C. to about 700° C. The island 3111, the island 3112, the island 3113 and the island 3114 may be formed at a temperature from about 700° C. to about 800° C.

As shown in FIG. 5A, at the initial stage of the growth of the island 3111, the island 3112, the island 3113 and the island 3114, some of the dislocations, such as the dislocation 411, are terminated at an interface between the layer 21 and the island 3111, and some of the dislocations, such as the dislocation 412 and the dislocation 412', may extend into the island 3111, the island 3112, the island 3113 and the island 3114.

Figure 5B:
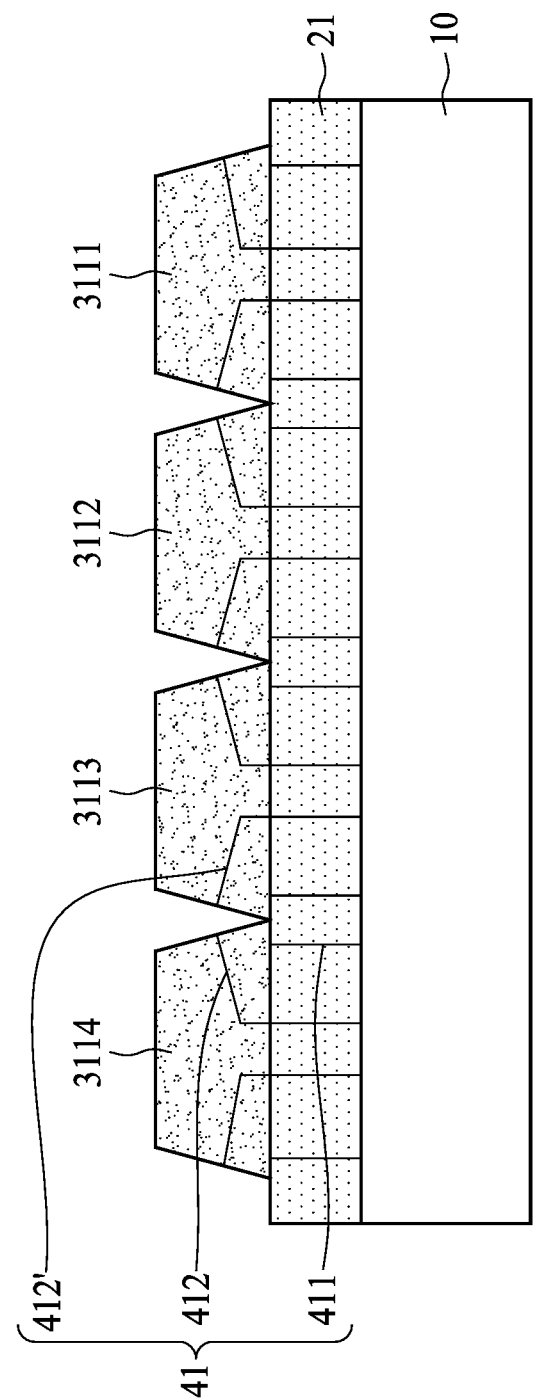

As shown in FIG. 5B, as the island 3111, the island 3112, the island 3113 and the island 3114 grow, the dislocation 412 and the dislocation 412' may be bent. For example, when the island 3111, the island 3112, the island 3113 and the island 3114 grow and have a thickness, such as 5 nm, the extending direction of the dislocation 412 and the dislocation 412' may be changed and toward a direction that is more horizontal with respect to the longitudinal direction.

Figure 5C:
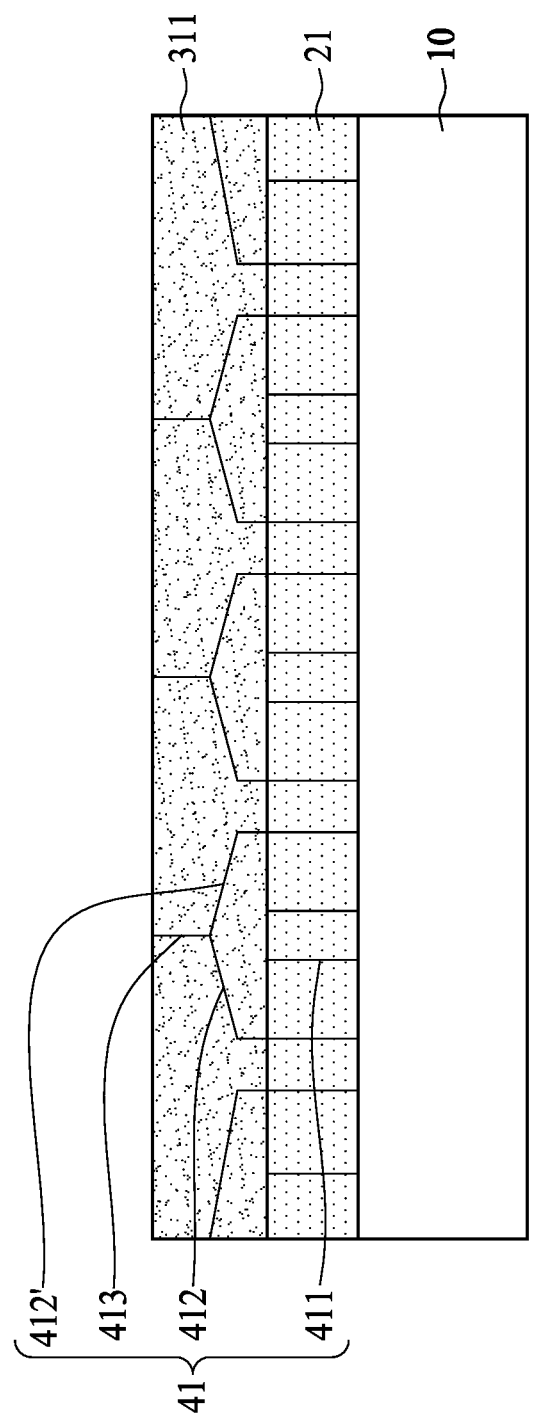

As shown in FIG. 5C, the sublayer 311 may be formed. The sublayer 311 may be formed by growing the island 3111, the island 3112, the island 3113 and the island 3114. The sublayer 311 may be formed by growing and merging the island 3111, the island 3112, the island 3113 and the island 3114. The dislocation 412 and the dislocation 412' may meet and terminate. The dislocation 413 may be generated from where the dislocation 412 and the dislocation 412' terminate.

The thickness of the sublayer 311 may range from about 10 nm to about 50 nm. The thickness of the sublayer 311 may range from about 50 nm to about 100 nm. When the sublayer 311 has a thickness from 10 nm to 100 nm, more than 50% of the dislocations, such as the dislocation 412 and the dislocation 412', may be bent.

As shown in FIG. 5C, the dislocation 41 may include the dislocation 411, the dislocation 412, the dislocation 412' and the dislocation 413.

Figure 5D:
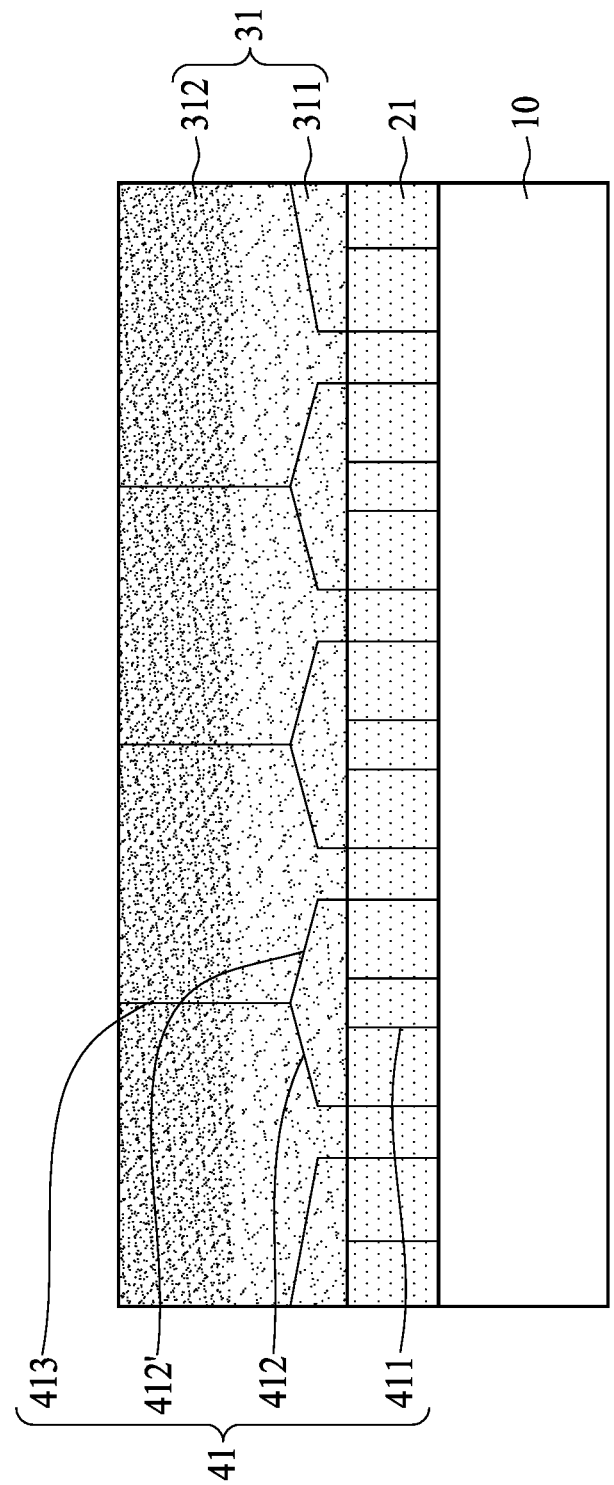

As shown in FIG. 5D, a sublayer 312 may be formed on the sublayer 311. The sublayer 312 may be formed at a temperature from about 1000° C. to about 1100° C. The thickness of the sublayer 312 may range from about 100 nm to about 200 nm. The thickness of the sublayer 312 may range from about 200 nm to about 300 nm. The thickness of the sublayer 312 may range from about 300 nm to about 400 nm. The thickness of the sublayer 312 may range from about 400 nm to about 500 nm.

As shown in FIG. 5D, the layer 31 may include the sublayer 311 and the sublayer 312.

Figure 6:
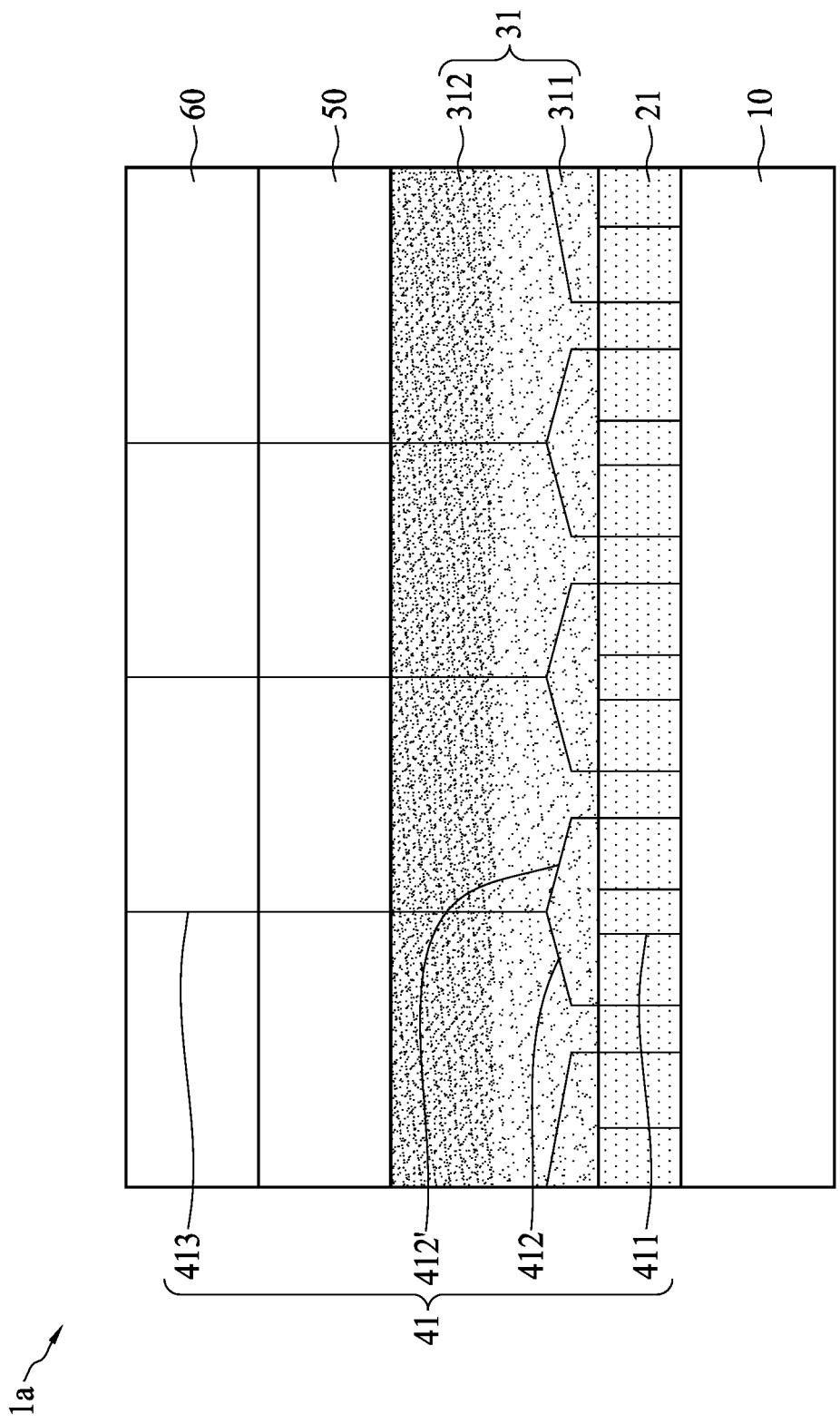

As shown in FIG. 6, a channel layer 50 and a barrier layer 60 may be formed. As shown in FIG. 6, the semiconductor device structure 1a may be produced. The method for manufacturing the semiconductor device structure 1a may include forming the layer 21 and the layer 31 with specific compositions, which reduces the defects extending along the longitudinal direction. Moreover, the method may include forming the sublayer 311 and the sublayer 312 with different process conditions, which assists in terminating defects.

Figure 7:
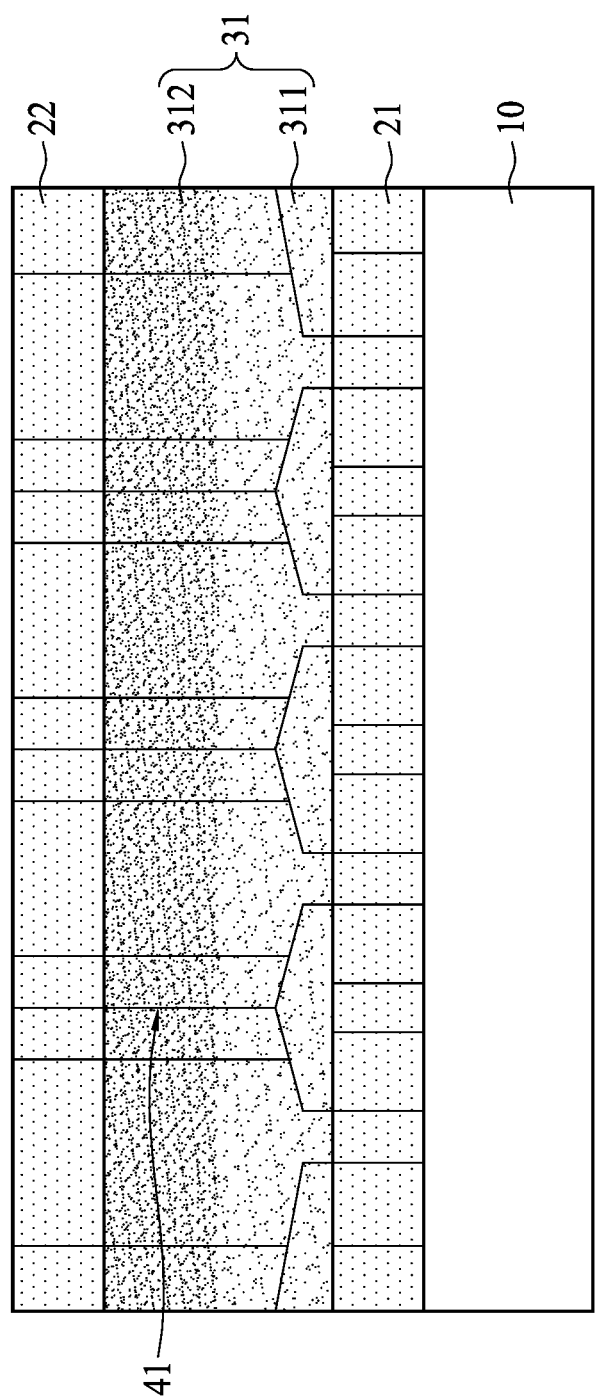
FIG. 7, FIG. 8 and FIG. 9 illustrate various stages of a method for manufacturing a semiconductor device structure in accordance with some embodiments of the present disclosure.
Figure 8:
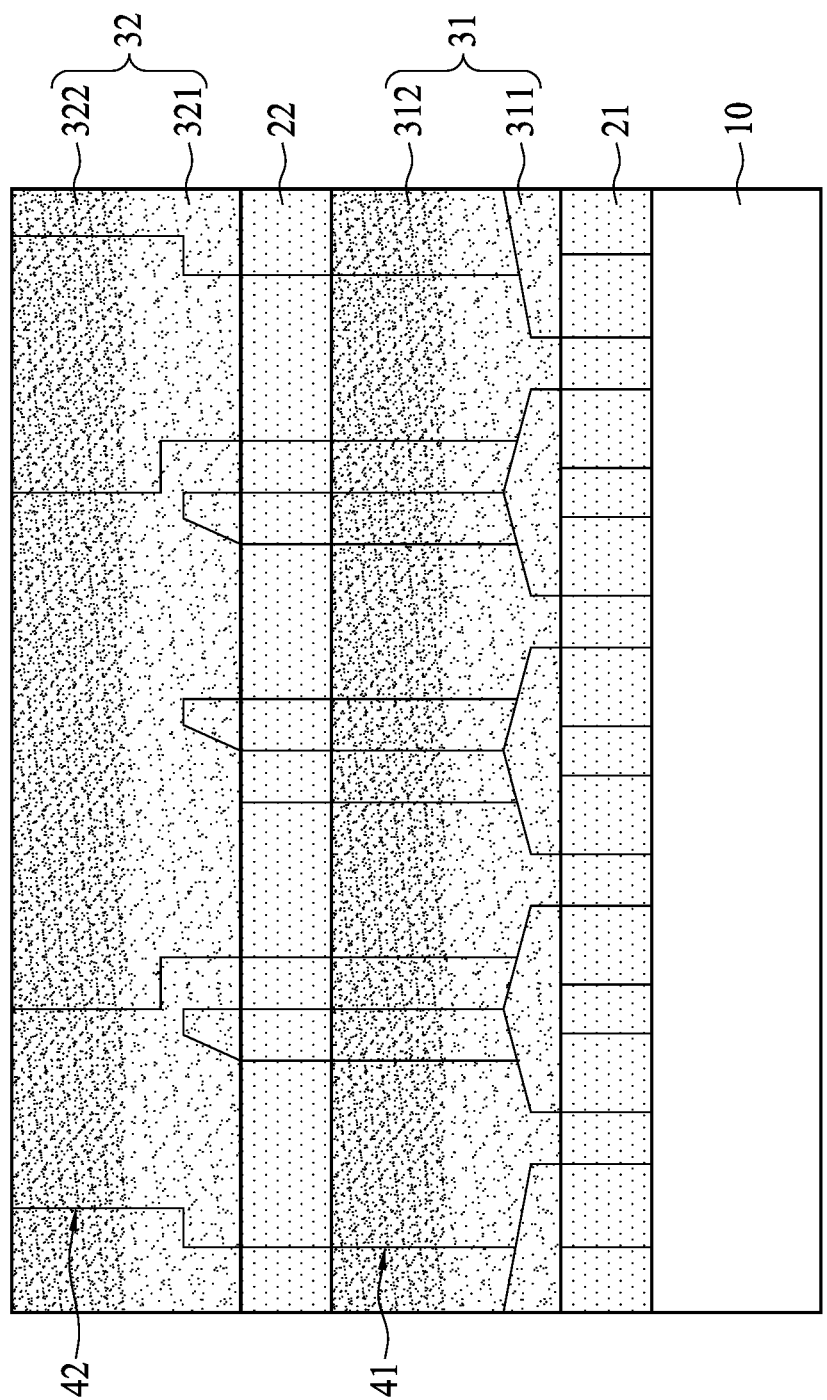
Figure 9:
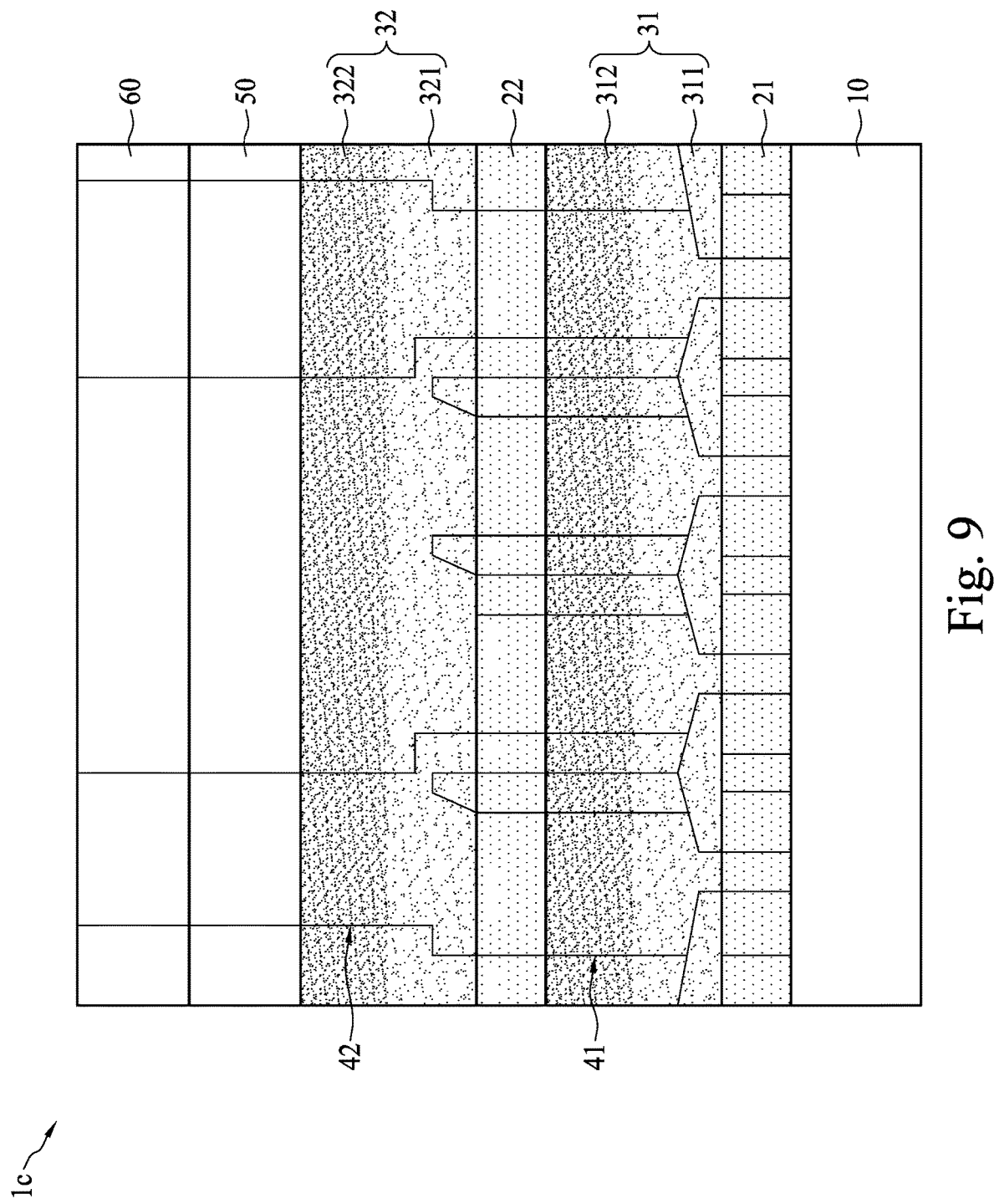

FIG. 7, FIG. 8 and FIG. 9 illustrate various stages of a method for manufacturing a semiconductor device structure 1c in accordance with some embodiments of the present disclosure. The initial stage of the illustrated operation is the same as, or similar to, the stage illustrated in FIG. 4, FIG. 5A, FIG. 5B, FIG. 5C, and FIG. 6.

FIG. 7 depict a stage subsequent to that depicted in FIG. 5D.

As shown in FIG. 7, the layer 22 may be formed. The layer 22 may be formed on the sublayer 312 of the layer 31. The operations for forming the layer 22 may be the same as or similar to those for forming the layer 21, and are not repeated herein.

As shown in FIG. 8, the sublayer 321 and the sublayer 322 may be formed. The operations for forming the sublayer 321 and the sublayer 322 may be the same as or similar to those for forming the sublayer 311 and the sublayer 312 respectively, and are not repeated herein. After the sublayer 321 and the sublayer 322 are formed, some dislocations are bent and terminate. Therefore, much fewer defects, such as the dislocations 42, extend along the longitudinal direction.

As shown in FIG. 9, a channel layer 50 and a barrier layer 60 may be formed. As shown in FIG. 9, the semiconductor device structure 1c may be produced. The method for manufacturing the semiconductor device structure 1c may include forming the layer 22 and the layer 32, which makes defects bend twice. As a result, much fewer defects extend into the channel layer 50 and the barrier layer 60, thereby improving the performance of the semiconductor device structure 1c.

As used herein, spatially relative terms, such as "beneath," "below," "lower," "above," "upper," "lower," "left," "right" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 80 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

As used herein, the terms "approximately", "substantially", "substantial" and "about" are used to describe and account for small variations. When used in conduction with an event or circumstance, the terms can refer to instances in which the event of circumstance occurs precisely as well as instances in which the event or circumstance occurs to a close approximation. As used herein with respect to a given value or range, the term "about" generally refers to within ±10%, ±5%, ±1%, or ±0.5% of the given value or range. Ranges can be expressed herein as from one endpoint to another endpoint or between two endpoints. All ranges disclosed herein are inclusive of the endpoints, unless specified otherwise. The term "substantially coplanar" can refer to two surfaces within micrometers (μm) of lying along a same plane, such as within 10 within 5 within 1 or within 0.5 μm of lying along the same plane. When referring to numerical values or characteristics as "substantially" the same, the term can refer to the values lying within ±10%, ±5%, ±1%, or ±0.5% of an average of the values.

The foregoing outlines features of several embodiments and detailed aspects of the present disclosure. The embodiments described in the present disclosure may be readily used as a basis for designing or modifying other processes and structures for carrying out the same or similar purposes and/or achieving the same or similar advantages of the embodiments introduced herein. Such equivalent constructions do not depart from the spirit and scope of the present disclosure, and various changes, substitutions, and alterations may be made without departing from the spirit and scope of the present disclosure.

What is claimed is:

1. A semiconductor device structure, comprising:
    a substrate;
    a first layer disposed on and in contact with the substrate, wherein the first layer comprises $Al_{X1}Ga_{(1-X1)}N$, wherein $0.5 \le X1 \le 1$;
    a second layer disposed on and in contact with the first layer, wherein the second layer comprises Al, Ga, In and N;
    a first nitride semiconductor layer on the second layer; and
    a second nitride semiconductor layer on the first nitride semiconductor layer and having a band gap larger than a band gap of the first nitride semiconductor layer.

2. The semiconductor device structure of claim 1, wherein the second layer comprises a first sublayer disposed on and in contact with the first layer, and wherein the first sublayer comprises $In_\alpha Al_\beta Ga_{(1-\alpha-\beta)}N$, $0 \le \alpha \le 0.5$ and $0 \le \beta \le 0.5$.

3. The semiconductor device structure of claim 1, wherein a density of dislocation in the second layer is less than a density of dislocation in the first layer.

4. The semiconductor device structure of claim 1, further comprising:
    a third layer disposed on and in contact with the second layer, wherein the third layer comprises $Al_{X2}Ga_{(1-X2)}N$, and $0.5 \le X2 \le 1$.

5. The semiconductor device structure of claim 4, further comprising:
    a fourth layer disposed on the third layer, wherein the fourth layer comprises a first sublayer in contact with the third layer, the first sublayer of the fourth layer comprises $Al_{Y2}Ga_{(1-Y2)}N$, and X2 is greater than Y2.

6. The semiconductor device structure of claim 5, wherein the fourth layer further comprises a second sublayer disposed on and in contact with the first sublayer of the fourth layer, the second sublayer of the fourth layer comprises $Al_{Z2}Ga_{(1-Z2)}N$, and $0 \le Z2 \le 0.5$.

7. The semiconductor device structure of claim 5, wherein a density of dislocation in the fourth layer is less than a density of dislocation in the second layer.

8. A semiconductor device structure, comprising:
    a substrate;
    a first layer disposed on and in contact with the substrate, wherein the first layer comprises Al, Ga and N;
    a second layer disposed on the first layer, wherein the second layer comprises a first sublayer in contact with the first layer, the first sublayer comprises Al, Ga, In and N, and a difference of a fraction of Al atoms relative to the total of Al plus Ga atoms between the first layer and the first sublayer of the second layer ranges from 0.25 to 0.5;
    a first nitride semiconductor layer on the second layer; and
    a second nitride semiconductor layer on the first nitride semiconductor layer and having a band gap larger than a band gap of the first nitride semiconductor layer.

9. The semiconductor device structure of claim 8, wherein the fraction of Al atoms relative to the total of Al plus Ga atoms in the first layer is greater than or equal to 0.5 and less than 1.

10. The semiconductor device structure of claim 8, wherein the fraction of Al atoms relative to the total of Al plus Ga atoms in the first sublayer of the second layer is greater than 0 and less than or equal to 0.5.

* * * * *